(12) United States Patent
Matsuyama

(10) Patent No.: US 12,394,607 B2
(45) Date of Patent: Aug. 19, 2025

(54) ATTRACTING METHOD

(71) Applicant: Tokyo Electron Limited, Tokyo (JP)

(72) Inventor: Shoichiro Matsuyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 18/187,805

(22) Filed: Mar. 22, 2023

(65) Prior Publication Data

US 2023/0238225 A1 Jul. 27, 2023

Related U.S. Application Data

(62) Division of application No. 17/077,241, filed on Oct. 22, 2020, now abandoned.

(30) Foreign Application Priority Data

Oct. 28, 2019 (JP) ................. 2019-195653

(51) Int. Cl.
*H01J 37/32* (2006.01)
*H01L 21/3065* (2006.01)
*H02N 13/00* (2006.01)

(52) U.S. Cl.
CPC .... *H01J 37/32715* (2013.01); *H01J 37/3244* (2013.01); *H02N 13/00* (2013.01); *H01J 2237/2007* (2013.01); *H01J 2237/334* (2013.01)

(58) Field of Classification Search
None
See application file for complete search history.

(56) References Cited

U.S. PATENT DOCUMENTS

2011/0056912 A1* 3/2011 Matsuyama ...... H01J 37/32623
427/571
2015/0135514 A1 5/2015 Sasaki et al.
2019/0311888 A1* 10/2019 Koshimizu ....... H01L 21/67248

FOREIGN PATENT DOCUMENTS

| CN | 105470191 | 4/2016 | |
| EP | 1780777 A1 * | 5/2007 | ............. F16D 25/14 |
| JP | H08-124913 | 5/1996 | |
| JP | 2003-332412 | 11/2003 | |
| JP | 2010-024487 | 2/2010 | |
| JP | 2015-099839 | 5/2015 | |
| WO | WO-2013046640 A1 * | 5/2013 | ........ H01J 37/32009 |

OTHER PUBLICATIONS

Translation of WO 2013046640 (Year: 2013).*

* cited by examiner

*Primary Examiner* — Shamim Ahmed
(74) *Attorney, Agent, or Firm* — IPUSA, PLLC

(57) ABSTRACT

A method of attracting an object to a mounting table is provided. The object is a substrate, an edge ring, or a combination of the substrate and the edge ring. The mounting table is provided with an electrostatic chuck including electrodes. After the object is placed on the electrostatic chuck, n-phase alternating current (AC) voltages (n≥2) are applied to the electrodes. Each phase voltage of the n-phase AC voltages has a phase different from each other, and the phase voltage of the n-phase AC voltages is applied based on a self-bias voltage of the object.

12 Claims, 5 Drawing Sheets

ATTRACTING METHOD

CROSS-REFERENCE TO RELATED APPLICATIONS

This application is a divisional application of and claims the benefit under 35 U.S.C. § 120 of U.S. patent application Ser. No. 17/077,241, filed Oct. 22, 2020, which claims priority to Japanese Patent Application No. 2019-195653 filed on Oct. 28, 2019. The entire contents of these applications are incorporated herein by reference.

TECHNICAL FIELD

The present disclosure relates to an attracting method, a mounting table, and a plasma processing apparatus.

BACKGROUND

In processing apparatuses that apply desired treatment, such as etching, on a substrate, a mounting table that attracts the substrate is known.

Patent Document 1 describes an electrostatic chuck device to which alternating current voltages (AC voltages) are applied. As the AC voltages applied to the electrostatic chuck device, n-phase AC voltages (n≥2) are applied. The electrostatic chuck device includes a sample stage and a circuit for applying the n-phase AC voltages. The sample stage includes electrodes to which the n-phase AC voltages are applied and an insulator for insulating the electrodes from each other.

RELATED ART DOCUMENT

Patent Document

[Patent Document 1] Japanese Laid-open Patent Application Publication No. 2003-332412

SUMMARY

In one aspect, the present disclosure provides an attracting method, a mounting table, and a plasma treatment apparatus that suppress reduction of attractive force.

In one aspect, a method of attracting an object to a mounting table is provided. The object is a substrate, an edge ring, or a combination of the substrate and the edge ring. The mounting table is provided with an electrostatic chuck including electrodes. After the object is placed on the electrostatic chuck, n-phase alternating current (AC) voltages (n≥2) are applied to the electrodes. Each phase voltage of the n-phase AC voltages has a phase different from each other, and the phase voltage of the n-phase AC voltages is applied based on a self-bias voltage of the object.

DETAILED DESCRIPTION OF EMBODIMENTS

Figure 1:
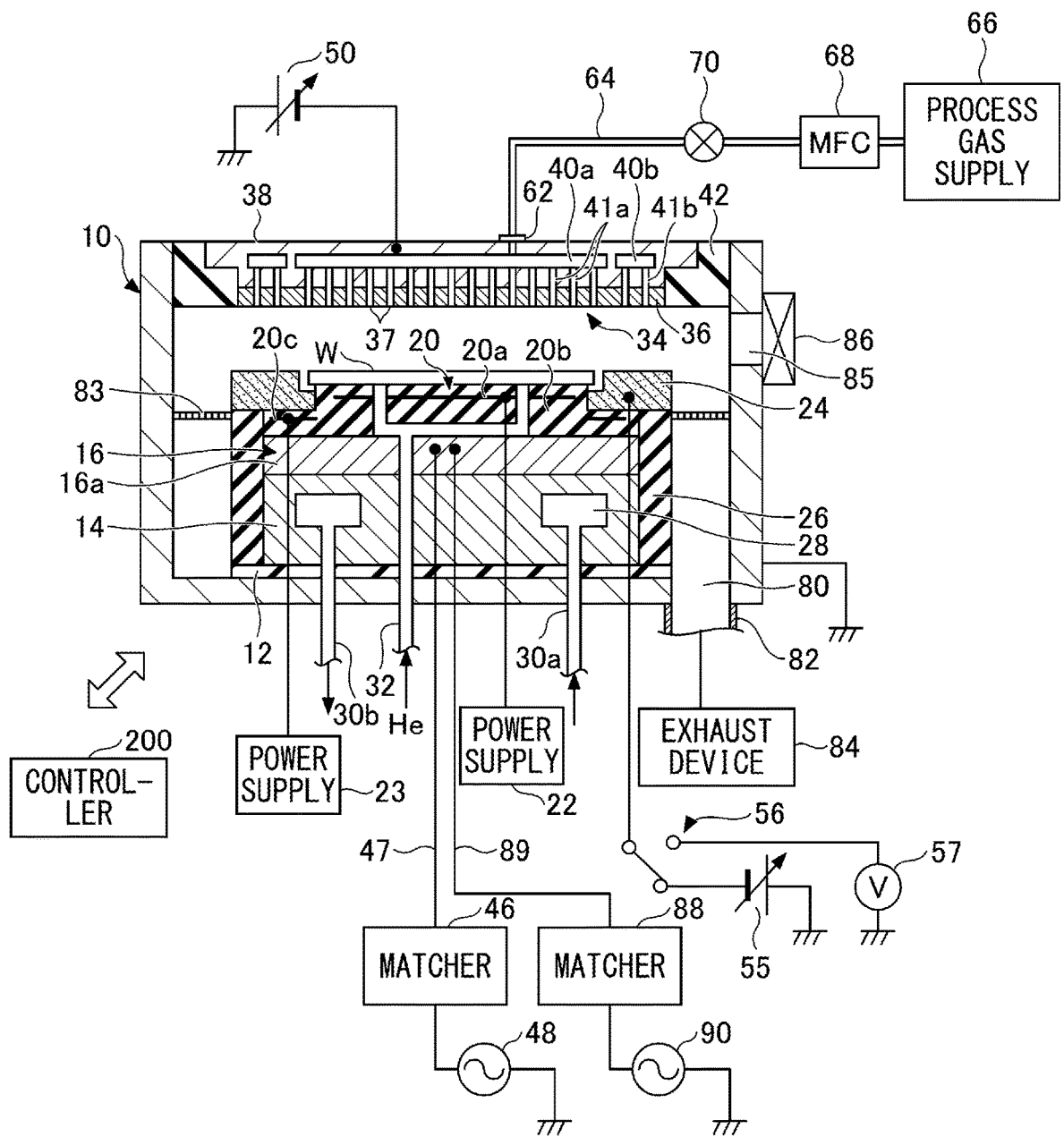
FIG. 1 is a cross-sectional diagram illustrating an example of a plasma processing apparatus according to an embodiment.

Hereinafter, embodiments for carrying out the present disclosure will be described with reference to the drawings. Note that in the drawings, elements having substantially identical features are given to the same reference symbols, and redundant descriptions will be omitted.

<Plasma Processing Apparatus>

A plasma processing apparatus 1 according to an embodiment will be described with reference to FIG. 1. FIG. 1 is a cross-sectional diagram illustrating an example of the plasma processing apparatus 1 according to the present embodiment. The plasma processing apparatus 1 according to the present embodiment is a capacitively coupled parallel plate processing apparatus, and includes a chamber 10. The chamber 10 is a cylindrical container formed of, for example, aluminum having a surface treated by anodic oxidation, and is grounded.

A cylindrical support platform 14 is disposed at the bottom of the chamber 10, via an insulating plate 12 made of ceramic or the like. On the support platform 14, for example, a mounting table 16 is provided. The mounting table 16 includes an electrostatic chuck 20 and a base 16a, and a wafer W is placed on the upper surface of the electrostatic chuck 20. An annular edge ring 24 made of silicon or the like is disposed around the wafer W. The edge ring 24 may also be referred to as a focus ring. The edge ring 24 is an example of an outer peripheral member disposed around the mounting table 16. Around the base 16a and the support platform 14, an annular insulator ring 26 made of quartz or the like is provided. Inside the electrostatic chuck 20, a first electrode 20a formed of a conductive film is embedded in an insulating layer 20b and is provided near the center of the electrostatic chuck 20. The first electrode 20a is connected to a power supply 22. Because voltage applied from the power supply 22 to the first electrode 20a causes a potential difference between the surface of the electrostatic chuck 20 and the wafer W which is an object to be attracted, the wafer W as the object to be attracted is attracted to the surface of the electrostatic chuck 20. In addition, inside the electrostatic chuck 20, a second electrode 20c made of a conductive film is embedded in the insulating layer 20b and is provided at the outer circumferential side of the electrostatic chuck 20. The second electrode 20c is connected to a power supply 23. Because voltage applied from the power supply 23 to the second electrode 20c causes a potential difference between the surface of the electrostatic chuck 20 and the edge ring 24 which is an object to be attracted, the edge ring 24 as the object to be attracted is attracted to the surface of the electrostatic chuck 20. The electrostatic chuck 20 may include a heater to control temperature.

Inside the support platform 14, a refrigerant chamber 28 is formed, for example, in the form of a ring or a vortex. A refrigerant at a predetermined temperature, such as cooling water, is supplied from the chiller unit (not illustrated), passes through a pipe 30a, the refrigerant chamber 28, and a pipe 30b, and is returned to the chiller unit. As the refrigerant circulates through such a path, the temperature of the wafer W can be controlled by the temperature of the refrigerant. In addition, a heat transfer gas, e.g., He gas, which is supplied from a heat transfer gas supply mechanism (not illustrated), is supplied to a gap between the surface of the electrostatic chuck 20 and the back surface of the wafer W, through a gas supply line 32. As this heat transfer gas increases the heat transfer coefficient between the surface of the electrostatic chuck 20 and the back surface of the wafer W, the temperature of the wafer W can be controlled by the temperature of the refrigerant more effectively. In addition, in a case in which the electrostatic chuck 20 is equipped with a heater, heating by the heater and cooling by the refrigerant enable high responsiveness and high precision control of the temperature of the wafer W. The plasma processing apparatus 1 may be configured such that the heat transfer gas, e.g., He gas, supplied from the heat transfer gas supply mechanism (not illustrated) is also supplied to a gap between the surface of the electrostatic chuck 20 and the back surface of the edge ring 24 through another gas supply line (not illustrated). In addition, by controlling the pressure of He gas supplied to the gap between the surface of the electrostatic chuck 20 and the back surface of the object to be attracted (wafer W and/or edge ring 24), heat transfer characteristics of the electrostatic chuck 20 and the object (wafer W and/or edge ring 24) may be controlled, and the temperature of the object (wafer W and/or edge ring 24) may be controlled.

An upper electrode 34 is provided on the ceiling of the chamber 10 so as to face the mounting table 16. A space between the upper electrode 34 and the mounting table 16 is a plasma processing space. The upper electrode 34 occludes an opening of the ceiling of the chamber 10 via a shielding member 42 of an insulating material. The upper electrode 34 has an electrode plate 36 and an electrode support 38. The electrode plate 36 is formed of a silicon-containing material such as silicon or SiC, and a large number of gas discharge holes 37 are formed on the surface of the electrode plate 36 facing the mounting table 16. The electrode support 38 removably supports the electrode plate 36, and is formed of a conductive material, such as aluminum having a surface treated by anodic oxidation. Inside the electrode support 38, a number of gas flow holes 41$a$ and a number of gas flow holes 41$b$ extend downward from gas diffusion chambers 40$a$ and 40$b$ respectively, and communicate with the gas discharge holes 37.

A gas inlet 62 is connected to a process gas supply 66 via a gas supply line 64. The gas supply line 64 is provided with a mass flow controller (MFC) 68 and an open/close valve 70 from the upstream side where the process gas supply 66 is located. A process gas is supplied from the process gas supply 66, and flow of the process gas is controlled by the mass flow controller 68 and the open/close valve 70. The process gas is supplied to the gas diffusion chambers 40$a$ and 40$b$ through the gas supply line 64, passes through the gas flow holes 41$a$ and 41$b$, and is discharged into the plasma processing space from the gas discharge holes 37 of the upper electrode 34. That is, the upper electrode 34 functions as a showerhead for supplying gas.

The plasma processing apparatus 1 includes a first radio frequency power supply 90 and a second radio frequency power supply 48. The first radio frequency power supply 90 is a power source that generates first radio frequency power (hereinafter referred to as "HF power"). The first radio frequency power has a frequency suitable for generating a plasma. The frequency of the first radio frequency power is, for example, in a range of 27 MHz to 100 MHz. The first radio frequency power supply 90 is connected to the base 16$a$ via a matcher 88 and a power supply line 89. The matcher 88 includes circuitry for causing the output impedance of the first radio frequency power supply 90 to match impedance of a load side (base 16$a$ side). The first radio frequency power supply 90 may be connected to the upper electrode 34 via the matcher 88.

The second radio frequency power supply 48 is a power source that generates second radio frequency power (hereinafter referred to as "LF power"). The second radio frequency power has a frequency lower than the frequency of the first radio frequency power. In a case in which the second radio frequency power is used in conjunction with the first radio frequency power, the second radio frequency power is used as radio frequency power for biasing in order to draw ions into the wafer W. The frequency of the second radio frequency power is, for example, in a range of 400 kHz to 13.56 MHz. The second radio frequency power supply 48 is connected to the base 16$a$ via a matcher 46 and a power supply line 47. The matcher 46 includes circuitry for causing the output impedance of the second radio frequency power supply 48 to match impedance of the load side (base 16$a$ side). According to the above-described configuration, the mounting table 16 also functions as a lower electrode. Note that pulsed DC may be used as electric power for biasing in order to draw ions to the wafer W. In this case, the plasma processing apparatus 1 has a pulsed DC power supply (not illustrated) instead of the second radio frequency power supply 48. The pulsed DC power supply is connected to the base 16$a$ via the power supply line 47. Alternatively, a composite wave in which multiple input voltage, such as pulsed DC (rectangular wave) and a triangular wave, are combined may be used as power for biasing to draw ions into the wafer W. In this case, the plasma processing apparatus 1 has a power supply that outputs the composite wave (not illustrated), instead of the second radio frequency power supply 48. The power supply for outputting the composite wave is connected to the base 16$a$ via the power supply line 47.

It should be noted that a plasma may be generated using the second radio frequency power without using a first radio frequency power. That is, a plasma may be generated by using only a single type of radio frequency power. In this case, the frequency of the second radio frequency power may be greater than 13.56 MHz, for example, 40 MHz. The plasma processing apparatus 1 may not include the first radio frequency power supply 90 and the matcher 88. The mounting table 16 serves as a lower electrodes. The upper electrode 34 serves a showerhead that supplies the gas.

A second variable power supply 50 is connected to the upper electrode 34, and applies DC voltage to the upper electrode 34. A first variable power supply 55 is connected to the edge ring 24, and applies DC voltage to the edge ring 24. The thickness of a sheath on the edge ring 24 is controlled, by applying DC voltage of a predetermined magnitude that is determined in accordance with an amount of abrasion of the edge ring 24, from the first variable power supply 55 to the edge ring 24. This eliminates a level difference between a sheath on the edge ring 24 and a sheath on the wafer W, and therefore an angle of incidence of ions that are incident on the wafer W is prevented from becoming oblique at the edge of the wafer W. As a result, this avoids occurrence of tilting, in which the shape of a recess formed on the wafer W becomes oblique.

A DC voltage detector 57 is also provided to measure the voltage of the edge ring 24. The DC voltage detector 57 is connected, via a switching device 56, to a wire that connects the first variable power supply 55 to the edge ring 24 at an intermediate segment of the wire. The switching device 56 is provided at the intermediate segment of the wire, and is configured to switch between a first state in which the edge ring 24 is electrically connected to the first variable power supply 55 and a second state in which the edge ring 24 is electrically connected to the DC voltage detector 57. By switching the switching device 56 to the first state, voltage can be applied to the edge ring 24 from the first variable power supply 55. By switching the switching device 56 to the second state, voltage of the edge ring 24 as a cathode (i.e., potential difference between the edge ring 24 and the ground) incurred due to difference in moving speed between electron and ion during plasma processing, can be detected. The voltage (more precisely, DC component of the voltage) incurred due to difference in moving speed between electron and ion during plasma processing may be referred to as "DC self-bias voltage" (or "self-bias voltage"). In the following description, self-bias voltage of an object (e.g., edge ring 24 or wafer W) to be attracted by the electrostatic chuck 20 may be denoted by "Vdc".

An exhaust device 84 is connected to an exhaust pipe 82. The exhaust device 84 includes a vacuum pump such as a turbomolecular pump, which evacuates via the exhaust pipe 82 from an exhaust port 80 formed at the bottom of the chamber 10 to reduce the pressure in the chamber 10 to a desired degree of vacuum. The exhaust device 84 also controls the pressure in the chamber 10 to be constant while using a value of a pressure gauge (not illustrated) to measure the pressure in the chamber 10. A loading/unloading port 85 is provided at the side wall of the chamber 10. The wafer W is loaded into and unloaded from the loading/unloading port 85 by opening and closing a gate valve 86.

An annular baffle plate 83 is disposed between the outer side surface of the insulator ring 26 and the inner side wall of the chamber 10. The baffle plate 83 is provided with multiple through-holes, and is formed of aluminum. The surface of the baffle plate 83 is coated with ceramic such as $Y_2O_3$.

When performing predetermined plasma processing, such as plasma etching, in the plasma processing apparatus 1 according to the above-described configuration, the gate valve 86 is opened, and the wafer W is loaded into the chamber 10 through the loading/unloading port 85. The wafer W loaded into the chamber 10 is placed on the wafer mounting surface of the electrostatic chuck 20, and the gate valve 86 is closed. Also, on the edge ring mounting surface of the electrostatic chuck 20, the edge ring 24 is placed. A process gas is supplied to the interior of the chamber 10, and the interior of the chamber 10 is evacuated by the exhaust device 84.

The first radio frequency power and the second radio frequency power are applied to the mounting table 16. The power supply 22 then applies voltage to the first electrode 20a of the electrostatic chuck 20 to attract the wafer W to the wafer mounting surface of the electrostatic chuck 20. The power supply 23 also applies voltage to the second electrode 20c of the electrostatic chuck 20 to attract the edge ring 24 to the edge ring mounting surface of the electrostatic chuck 20. Note that DC voltage may be applied from the second variable power supply 50 to the upper electrode 34.

Plasma processing, such as etching, is applied to the surface of the wafer W to be processed by means of radicals or ions in a plasma generated in the plasma processing space.

The plasma processing apparatus 1 is provided with a controller 200 that controls operations of an entirety of the plasma processing apparatus 1. A central processing unit (CPU) provided in the controller 200 performs desired plasma processing, such as etching, in accordance with a recipe stored in a memory such as a ROM or a RAM. The recipe may include control information of the plasma processing apparatus 1 with respect to a process condition, such as processing time, pressure (gas exhaust), first and second radio frequency power or voltage, and various gas flow rates. The recipe may also include information about temperatures in the chamber (e.g., upper electrode temperature, chamber sidewall temperature, wafer W temperature, and electrostatic chuck temperature), a temperature of the refrigerant output from the chiller, and the like. A program and the recipe representing these process conditions may be stored in a hard disk drive or a semiconductor memory. The recipe may also be stored in a removable computer-readable storage medium such as a CD-ROM, a DVD, or the like, and by the portable computer-readable storage medium being loaded in a predetermined location, the recipe may be read from the portable computer-readable storage medium.

Figure 2A:
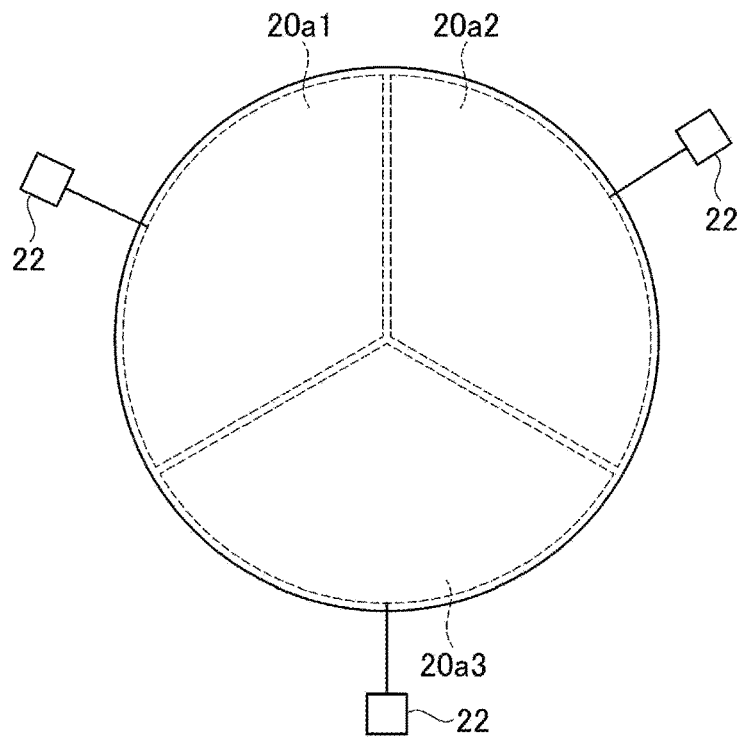
FIGS. 2A and 2B are diagrams illustrating an example of an arrangement of electrodes in an electrostatic chuck.
Figure 2B:
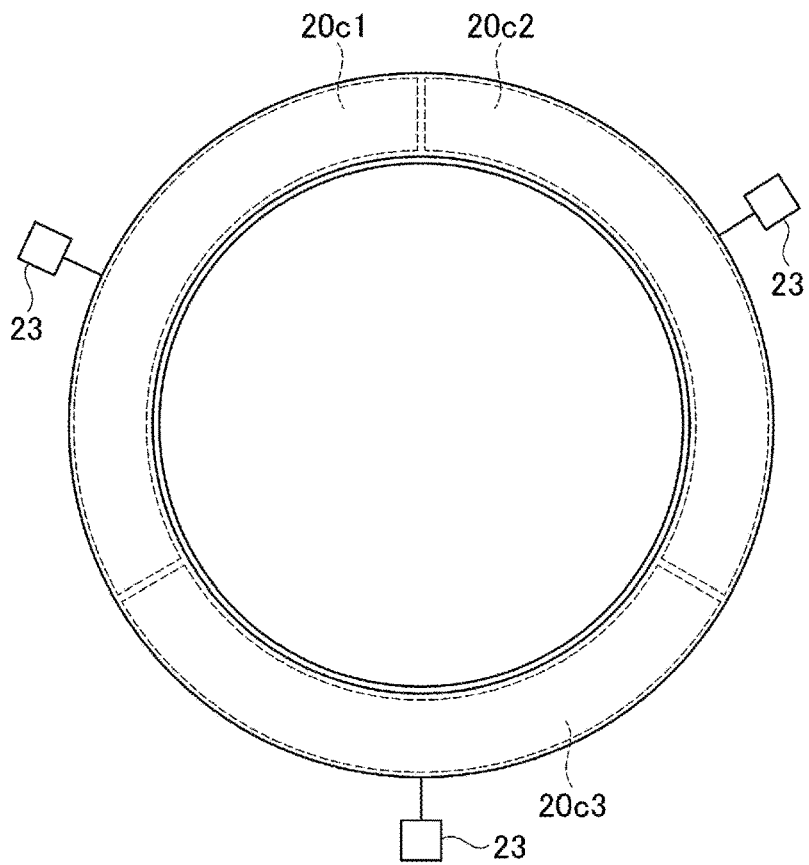

Next, arrangement of electrodes in the electrostatic chuck 20 on the mounting table 16 will be further described with reference to FIGS. 2A and 2B. FIG. 2A is a plan view illustrating an example of arrangement of the first electrode 20a in the wafer mounting surface of the electrostatic chuck 20. FIG. 2B is a plan view illustrating an example of arrangement of the second electrode 20c in the edge ring mounting surface of the electrostatic chuck 20.

As illustrated in FIG. 2A, the first electrode 20a at the wafer mounting surface includes three electrodes. In the present embodiment, these three electrodes are referred to as an electrode 20a1, an electrode 20a2, and an electrode 20a3, respectively. Each of the electrodes 20a1, 20a2, and 20a3 has a generally fanned planar shape, and the electrodes 20a1, 20a2, and 20a3 are arranged in a circumferential direction with respect to the central axis of the electrostatic chuck 20. The power supply 22 is connected to the electrodes 20a1, 20a2, and 20a3. The power supply 22 generates alternating current (AC) voltages (i.e., n-phase AC voltages (n≥2)).

As illustrated in FIG. 2B, the second electrode 20c at the edge ring mounting surface includes three electrodes, electrodes 20c1, 20c2, and 20c3. Each of the electrodes 20c1, 20c2, and 20c3 has a shape like an arc, and the electrodes 20c1, 20c2, and 20c3 are arranged in the circumferential direction with respect to the central axis of the electrostatic chuck 20. The power supply 23 is connected to the electrodes 20c1, 20c2, and 20c3. The power supply 23 generates AC voltages (i.e., n-phase AC voltages (n≥2)).

Although the configuration in which the electrodes (electrodes 20a1, 20a2, and 20a3) in the first electrode 20a are arranged in a circumferential direction has been described above, arrangement of the electrodes is not limited thereto. The electrodes may be arranged in a radial direction. Further, although the configuration in which the electrodes (electrodes 20c1, 20c2, and 20c3) in the second electrode 20c are arranged in a circumferential direction has been described above, arrangement of the electrodes is not limited thereto. The electrodes may be arranged in a radial direction.

Figure 3A:
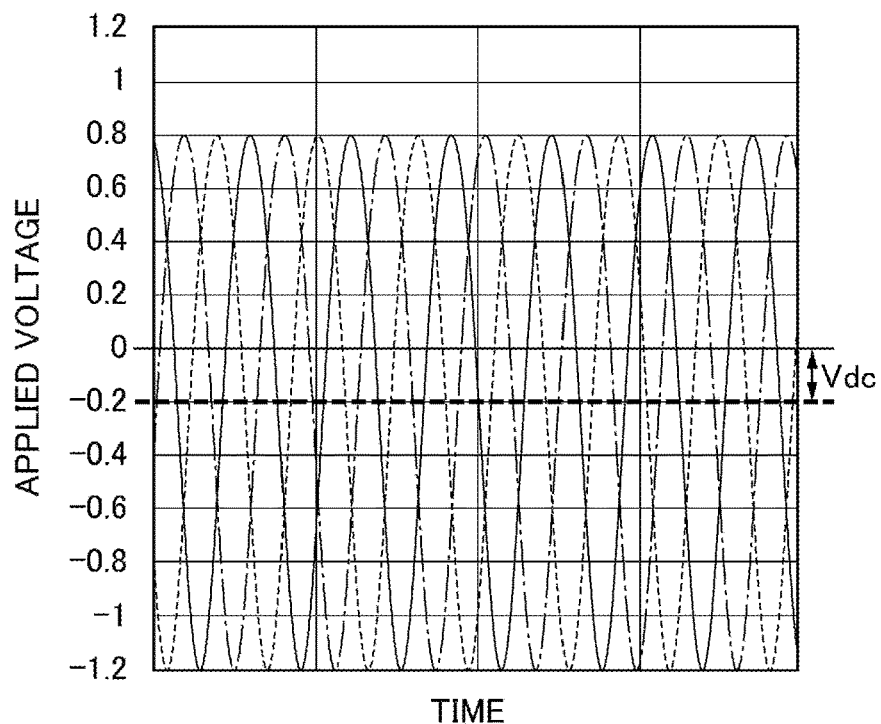
FIG. 3A is a graph illustrating an example of three-phase AC voltages applied to the electrodes.

Next, three-phase AC voltages applied to the second electrode 20c (electrodes 20c1, 20c2, and 20c3) will be described with reference to FIG. 3A. FIG. 3A is a graph illustrating an example of the three-phase AC voltages applied to the electrodes 20c1, 20c2, and 20c3. The vertical axis indicates voltage (phase voltage) applied to the electrodes 20c1, 20c2, and 20c3 (note that the voltage applied to the electrodes may also be referred to as "applied voltage"), and the horizontal axis indicates time. In the description of the present embodiment, unless otherwise stated, "voltage" at a certain point (or voltage applied to the certain point) refers to a potential difference (voltage) between the certain point and the ground. An example of the AC voltage (phase voltage) applied to the electrode 20c1 is illustrated in a solid line curve, an example of the AC voltage (phase voltage) applied to the electrode 20c2 is illustrated in a dashed-dotted line curve, and an example of the AC voltage (phase voltage) applied to the electrode 20c3 is illustrated in a broken line curve. The amplitude of each of the applied voltages is normalized to 1.

In the present embodiment, the AC voltage (phase voltage) applied to each of the electrodes 20c1, 20c2, and 20c3 from the power supply 23 has the same peak amplitude, the same frequency, and a phase different from each other. For example, the phase difference between the AC voltages applied to the electrodes 20c1, 20c2, and 20c3 is set to 120°.

Also, the AC voltages (phase voltages) applied to the electrodes 20c1, 20c2, and 20c3 from the power supply 23 are determined based on the self-bias voltage Vdc of the edge ring 24. For example, the AC voltages on the basis of the self-bias voltage Vdc of the edge ring 24 are applied to the electrodes 20c1, 20c2, and 20c3 from the power supply 23. In other words, an average value of the voltage applied from the power supply 23 to each of the electrodes 20c1, 20c2, and 20c3 is shifted by the magnitude of the self-bias voltage Vdc of the edge ring 24. In other words, the AC voltage applied from the power supply 23 to each of the electrodes 20c1, 20c2, and 20c3 is obtained by superimposing, on an AC component, a negative DC voltage component having a magnitude based on the magnitude of the self-bias voltage Vdc of the edge ring 24 (i.e., the AC voltage applied from the power supply 23 to each of the electrodes 20c1, 20c2, and 20c3 is made by offsetting an AC component by the magnitude of the negative DC voltage component based on the self-bias voltage Vdc of the edge ring 24). FIG. 3A illustrates a case in which the AC voltages applied are offset by −0.2 (i.e., the self-bias voltage Vdc of the edge ring 24 is −0.2).

The magnitude of self-bias voltage Vdc of the edge ring 24 is detected by, for example, the DC voltage detector 57. A method of detecting the magnitude of the self-bias voltage Vdc is not limited thereto, and other methods may be used. Alternatively, a predetermined value may also be used as the magnitude of the self-bias voltage Vdc. For example, the self-bias voltage Vdc may be obtained in advance through experiments, simulations, or the like, and the self-bias voltage Vdc obtained in advance may be stored, as the predetermined value, in the memory of the controller 200. Alternatively, the relationship between self-bias voltage Vdc and a plasma generation condition (e.g., LF power used as the radio frequency power for biasing) may be determined in advance, and the self-bias voltage Vdc may be estimated based on the relationship and the plasma generation conditions.

Figure 3B:
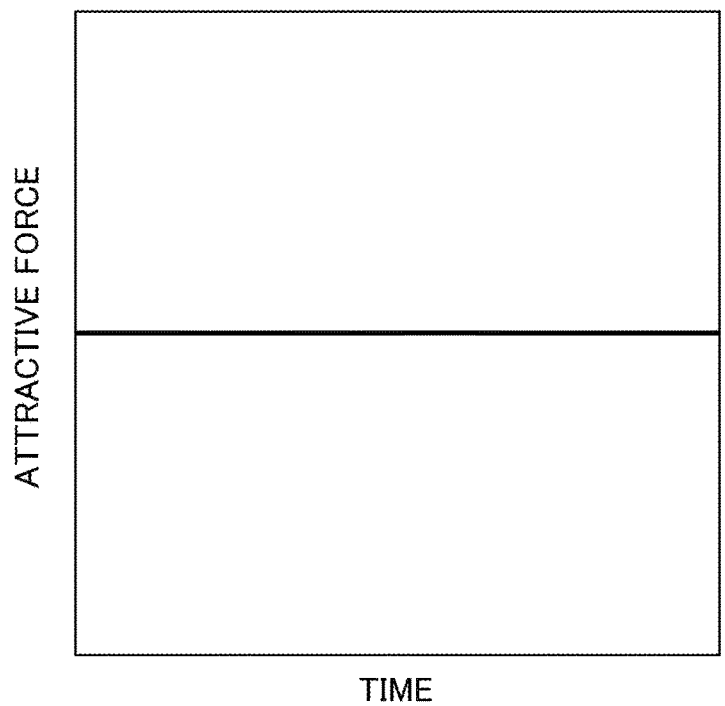
FIG. 3B is a graph illustrating an example of a sum of attractive force when the three-phase AC voltages are applied.

The attractive force generated in the edge ring 24 when three-phase AC voltages illustrated in FIG. 3A are applied to the second electrode 20c (electrodes 20c1, 20c2, and 20c3) is described with reference to FIG. 3B. FIG. 3B is a graph illustrating an example of a sum of attractive force generated in the edge ring 24 when the three-phase AC voltages are applied to the electrodes 20c1, 20c2, and 20c3. The vertical axis indicates the sum of the attractive force and the horizontal axis indicates time. As illustrated in FIG. 3B, the attractive force of the mounting table 16 for attracting the edge ring 24 can be made constant.

In addition, with respect to the first electrode 20a (electrodes 20a1, 20a2, and 20a3), by applying the three-phase AC voltages as illustrated in FIG. 3A to the first electrode 20a (electrodes 20a1, 20a2, and 20a3), similar to the case of the second electrode 20c (electrodes 20c1, 20c2, and 20c3), the attractive force for attracting the wafer W to the mounting table 16 can be made constant as illustrated in FIG. 3B.

The AC voltages (phase voltages) applied to the electrodes 20a1, 20a2, and 20a3 from the power supply 22 are determined based on the self-bias voltage Vdc of the wafer W. For example, AC voltages on the basis of the self-bias voltage Vdc of the wafer W are applied to the electrodes 20a1, 20a2, and 20a3 from the power supply 22. In other words, an average value of the voltage applied from the power supply 22 to each of the electrodes 20a1, 20a2, and 20a3 is shifted by the magnitude of the self-bias voltage Vdc of the wafer W. In other words, the AC voltage applied from the power supply 22 to each of the electrodes 20a1, 20a2, and 20a3 is obtained by superimposing, on an AC component, a negative DC voltage component based on the self-bias voltage Vdc of the wafer W (i.e., the AC voltage applied from the power supply 22 to each of the electrodes 20a1, 20a2, and 20a3 is made by offsetting an AC component by the magnitude of the negative DC voltage component based on the self-bias voltage Vdc of the wafer W).

A DC voltage detector (not illustrated) for detecting the self-bias voltage Vdc of the wafer W may be provided. Alternatively, a predetermined value may also be used as the magnitude of the self-bias voltage Vdc. For example, the self-bias voltage Vdc may be obtained in advance through experiments, simulations, or the like, and the self-bias voltage Vdc obtained in advance may be stored, as the predetermined value, in the memory of the controller 200. Alternatively, the relationship between self-bias voltage Vdc and a plasma generation condition (e.g., LF power) may be determined in advance, and the self-bias voltage Vdc may be estimated based on the relationship and the plasma generation condition. In another embodiment, the relationship between self-bias voltage of the edge ring 24 and self-bias voltage of the wafer W may be obtained in advance, and the self-bias voltage of the wafer W may be estimated based on the relationship and the self-bias voltage of the edge ring 24 detected by the DC voltage detector 57.

In the above description with reference to FIGS. 2A to 3B, a case, in which both the number of electrodes in the first electrode 20a and the number of electrodes in the second electrode 20c are three, is described. However, the present invention is not limited thereto. Each of the first electrode 20a and the second electrode 20c may have two electrodes, or may have four or more electrodes. Also, a case in which the number of electrodes in the first electrode 20a is the same as the number of electrodes in the second electrode 20c has been described above, but the number of electrodes in the first electrode 20a and the number of electrodes in the second electrode 20c may differ.

Figure 4A:
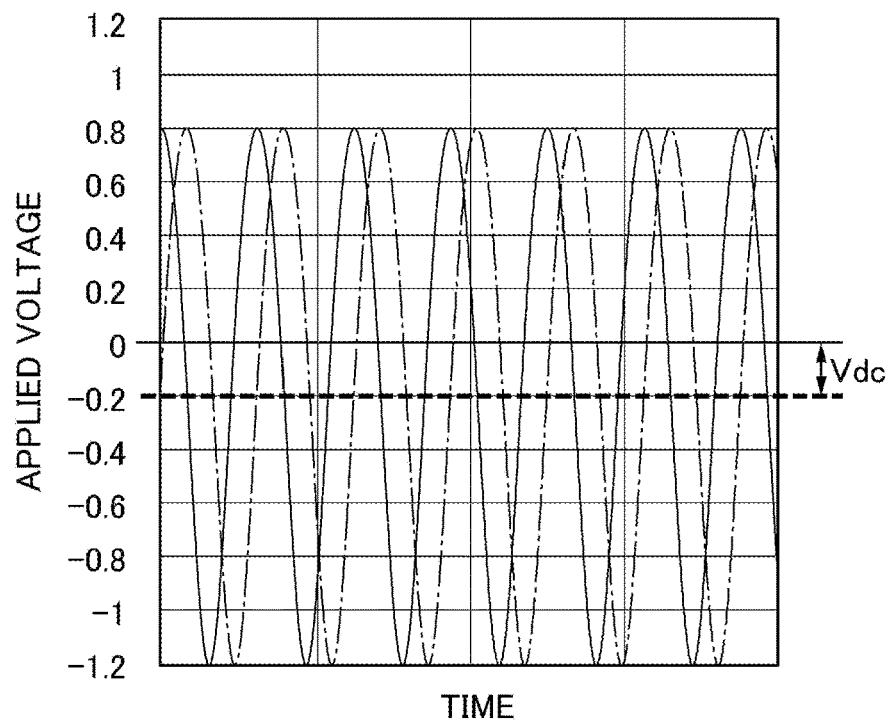
FIG. 4A is a graph illustrating an example of two-phase AC voltages applied to the electrodes.
Figure 4B:
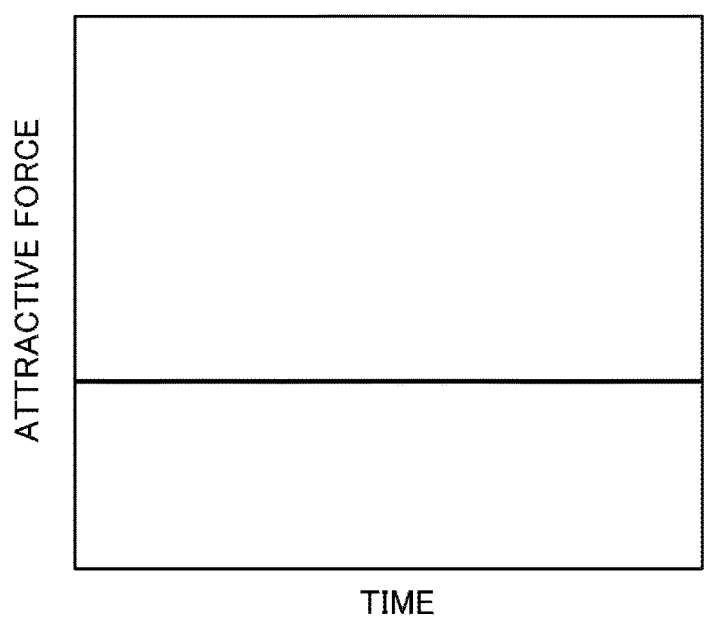
FIG. 4B is a graph illustrating an example of a sum of attractive force when the two-phase AC voltages are applied.

A case in which the number of electrodes in the second electrode 20c is two will be further described with reference to FIGS. 4A and 4B. FIG. 4A is a graph illustrating an example of two-phase AC voltages applied to the electrodes when the number of the electrodes in the second electrode 20c is two. The vertical axis indicates applied voltage, and the horizontal axis indicates time. An example of AC voltage applied to a first electrode in the second electrode 20c is illustrated in solid line curve, and an example of AC voltage applied to a second electrode in the second electrode 20c is illustrated in dashed-dotted line curve. The amplitude of the applied voltages is normalized to 1.

The AC voltages applied to the electrodes in the second electrode 20c from the power supply 23 have the same peak amplitude and the same frequency, and there is a phase difference between the AC voltages. For example, the phase difference of the AC voltages applied to the electrodes in the second electrode 20c is set to 90°. Also, the AC voltages applied to the electrodes in the second electrode 20c from the power supply 23 are determined based on the self-bias voltage Vdc of the edge ring 24. For example, the AC voltages on the basis of the self-bias voltage Vdc of the edge ring 24 are applied to the electrodes in the second electrode 20c from the power supply 23. In other words, an average value of voltage applied to each of the electrodes in the second electrode 20c from the power supply 23 is shifted by the magnitude of the self-bias voltage Vdc of the edge ring 24. In other words, the AC voltage applied to each of the electrodes in the second electrode 20c from the power supply 23 is obtained by superimposing, on an AC component, a negative DC voltage component having a magnitude based on the magnitude of the self-bias voltage Vdc of the edge ring 24 (i.e., the AC voltage applied from the power supply 23 to each of the electrodes in the second electrode 20c is made by offsetting an AC component by the magnitude of the negative DC voltage component based on the self-bias voltage Vdc of the edge ring 24). FIG. 4A illustrates a case in which the AC voltages applied are offset by −0.2 (i.e., the self-bias voltage Vdc of the edge ring 24 is −0.2).

Attractive force generated in the edge ring 24 when two-phase AC voltages illustrated in FIG. 4A are applied to the electrodes in the second electrode 20c will be described with reference to FIG. 4B. FIG. 4B is a graph illustrating an example of a sum of the attractive force of the edge ring 24 when the two-phase AC voltages are applied to the electrodes in the second electrode 20c. The vertical axis indicates the sum of the attractive force and the horizontal axis indicates time. As illustrated in FIG. 4B, even if the number of electrodes in the second electrode 20c is two, the attractive force by which the mounting table 16 attracts the edge ring 24 can be kept constant.

A method of attracting an object to the mounting table 16 (electrostatic chuck 20) of the plasma processing apparatus 1 according to the present embodiment will be described in comparison with reference examples.

An attracting method according to a first reference example will be briefly described. In the attracting method according to the first reference example, DC voltage is applied to each of the first and second electrodes 20a and 20c in the electrostatic chuck 20 to attract the wafer W and the edge ring 24 to the mounting table 16. In the method of applying DC voltage, as time when the wafer W and the edge ring 24 are attracted to the mounting table 16 increases, electrical charges in the wafer W or the edge ring 24 move to the insulating layer 20b of the electrostatic chuck 20. Therefore, because the voltage substantially applied between the electrostatic chuck 20 and the wafer W or the edge ring 24 decreases, electrostatic attractive force decreases. In addition, during plasma processing, heat of the plasma enters the mounting table 16. As the temperature of the mounting table 16 increases, it becomes easier for an electrical charge to move. Thus, as the voltage substantially applied between the electrostatic chuck 20 and the wafer W or the edge ring 24 further decreases, the electrostatic attractive force further decreases.

In contrast, in the attracting method performed by the mounting table 16 of the plasma processing apparatus 1 according to the present embodiment, by applying AC voltages to the first and second electrodes 20a and 20c in the electrostatic chuck 20, the wafer W and the edge ring 24 are attracted to the mounting table 16. Accordingly, even though the wafer W and the edge ring 24 are attracted for a long time, decrease in electrostatic attractive force caused by movement of electrical charge can be prevented.

Next, an attracting method according to a second reference example will be briefly described. In the attracting method according to the second reference example, AC voltages are applied to the first and second electrodes 20a and 20c in the electrostatic chuck 20 to attract the wafer W and the edge ring 24 to the mounting table 16. In the second reference example, an average value of each of the AC voltages applied is set to 0 V (ground).

Figure 5A:
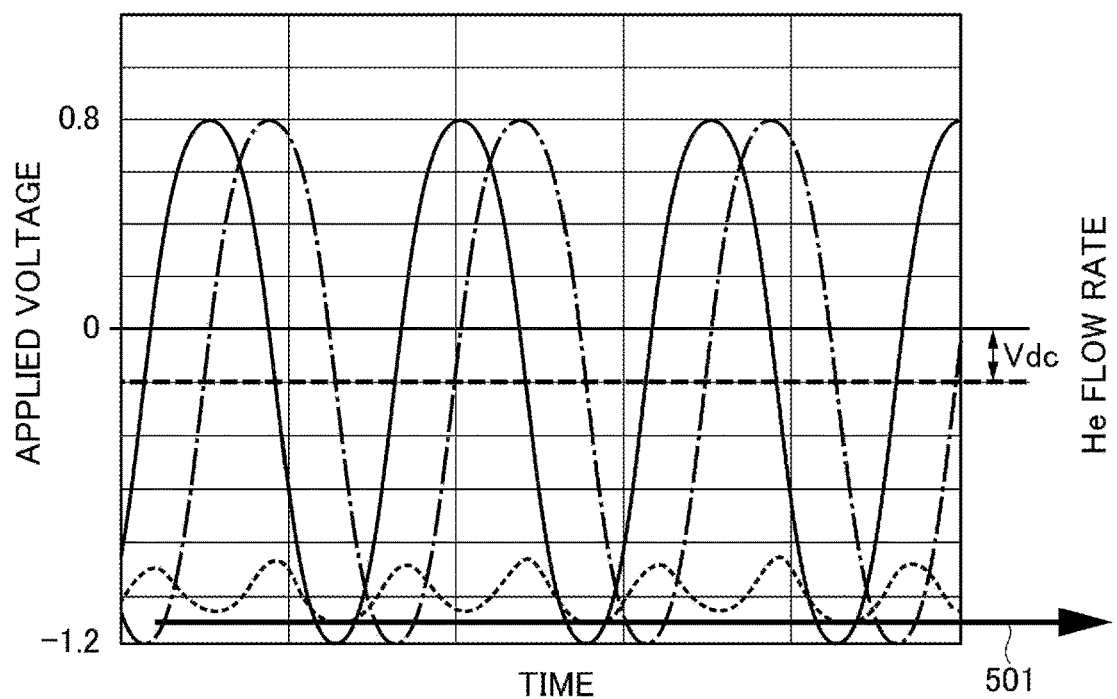
FIGS. 5A and 5B are graphs illustrating examples of a relationship between applied voltage and a flow rate of a heat transfer gas.
Figure 5B:
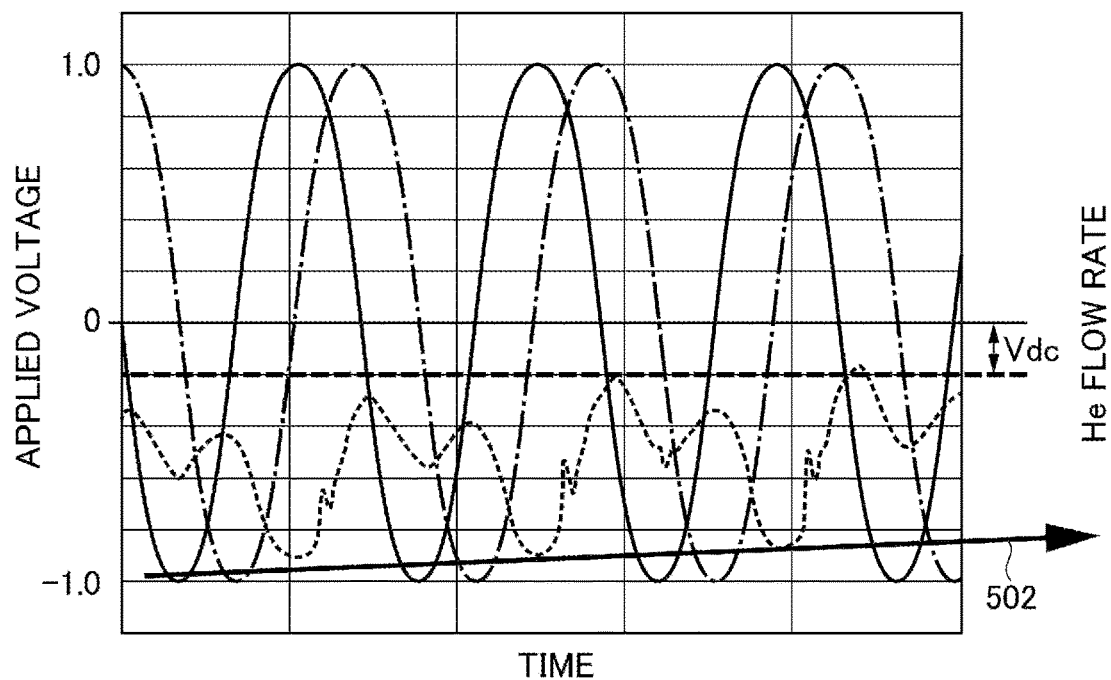

FIGS. 5A and 5B are graphs illustrating examples of a relationship between the applied voltage and a flow rate of a heat transfer gas (He gas). FIG. 5A illustrates a case of the present embodiment, and FIG. 5B illustrates a case of the second reference example. The vertical axis on the left side in the graphs indicates applied voltage, the vertical axis on the right side indicates a flow rate of He gas, which is a heat transfer gas supplied between the upper surface of the electrostatic chuck 20 and the bottom surface of the edge ring 24, and the horizontal axis indicates time. In the graphs, an example of AC voltage applied to one electrode in the second electrode 20c is illustrated in a solid line curve, and an example of AC voltage applied to the other electrode in the second electrode 20c is illustrated in a dashed-dotted line curve. The amplitude of the applied voltage is normalized to 1. Further, a flow rate of He gas is illustrated in a broken line curve. Here, a case in which two-phase AC voltage is applied is described.

During plasma processing, negative self-bias voltage Vdc is generated at the edge ring 24. Thus, in the example of FIG. 5B, a period of time when voltage at an electrode relative to the edge ring 24 is positive is longer than a period of time when voltage at the electrode relative to the edge ring 24 is negative. Also, the maximum absolute value of the voltage at the electrode relative to the edge ring 24 during the period when the voltage is positive is greater than the maximum absolute value of the voltage at the electrode relative to the edge ring 24 during the period when the voltage is negative. Because of these reasons, as in the case of applying DC voltage described in the first reference example, electrical charge on the edge ring 24 moves to the insulating layer 20b of the electrostatic chuck 20 as time for attracting the edge ring 24 to the mounting table 16 increases. Therefore, as a period of time when the edge ring 24 is attracted to the mounting table 16 increases, the voltage substantial applied decreases, and attractive force of the edge ring 24 decreases. In addition, due to the difference between the average value of the applied AC voltage and an electric potential (voltage relative to the ground) of the edge ring 24 (self-bias voltage Vdc), a sum of the attractive force of the edge ring 24 oscillates, and stable attractive force is not obtained.

Here, as the attractive force for attracting the edge ring 24 to the mounting table 16 decreases, a gap between the upper surface of the electrostatic chuck 20 and the back surface of the edge ring 24 increases, and the flow rate of He gas supplied to the gap increases. In a case in which the average value of the applied voltage is 0 V, the flow rate of He gas gradually increases, as indicated by the arrow 502 in FIG. 5B, indicating that the attractive force for attracting the edge ring 24 is decreasing. Also, fluctuation in the flow rate of He gas is greater than that illustrated in FIG. 5A, which will be described below.

In contrast, in the attracting method performed by the plasma processing apparatus 1 according to the present embodiment, as illustrated in FIG. 5A, AC voltages on the basis of the self-bias voltage Vdc of the edge ring 24 are applied to the electrodes in the mounting table 16. In other words, an average value of the applied AC voltage is offset by the self-bias voltage Vdc of the edge ring 24.

Thus, in the example of FIG. 5A, a period of time when voltage at an electrode relative to the edge ring 24 (self-bias voltage Vdc) is positive can be made to be equal to a period of time when voltage at the electrode relative to the edge ring is negative. Also, the maximum absolute value of the voltage at the electrode relative to the edge ring 24 during the period when the voltage is positive can be made to be equal to the maximum absolute value of the voltage at the electrode relative to the edge ring 24 during the period when the voltage is negative. Therefore, it is possible to prevent electrical charge on the edge ring 24 from moving to the insulating layer 20b of the electrostatic chuck 20 even if the time for attracting the edge ring 24 to the mounting table 16 increases. As indicated by the arrow 501 illustrated in FIG. 5A, increase in the flow rate of He gas is suppressed, indicating that decrease in the attractive force for attracting the edge ring 24 is suppressed. Also, fluctuation in the flow rate of He gas is smaller than that illustrated in FIG. 5B.

As described above, according to the attracting method of the mounting table 16 of the plasma processing apparatus 1 according to the present embodiment, even though a period of time when the electrostatic chuck 20 attracts an object (i.e., wafer W or edge ring 24) increases, decrease in attractive force can be suppressed. Accordingly, even in a process of attracting an object (wafer W, edge ring 24) for a long period of time, such as a process of making a 3D NAND device having a large number of layers, decrease in the attractive force can be prevented.

In the above description, a case in which AC voltage applied to each of the electrodes in the second electrode 20c (or the first electrode 20a) is obtained by superimposing the self-bias voltage Vdc of a negative value (in the example of FIG. 3A, Vdc was −0.2) on an AC component has been described. However, DC voltage to be superimposed on an AC component is not limited thereto. For example, negative DC voltage based on the self-bias voltage Vdc, such as −0.1, which is DC voltage having a magnitude of 50% of Vdc, may be superimposed on an AC component. Even in this case, because movement of electrical charge can be reduced compared to the case of the second reference example, decrease in attractive force for attracting an object to the electrostatic chuck 20 can be reduced to some extent.

Although the embodiments of the plasma processing apparatus 1 and the like have been described, the present disclosure is not limited to the above-described embodiments, and various modifications and enhancements can be made within the scope of the gist of the present disclosure described in the claims.

What is claimed is:

1. A method of attracting at least one object to a mounting table provided with an electrostatic chuck including electrodes, the method comprising:
   placing the object on the electrostatic chuck; and
   applying n-phase alternating current (AC) voltages (n≥2) to the electrodes, each phase voltage of the n-phase AC voltages having a phase different from each other, wherein
   the at least one object includes a substrate, an edge ring, or a combination of the substrate and the edge ring, and
   the phase voltage of the n-phase AC voltages is applied based on a self-bias voltage of the object.

2. The method according to claim 1, wherein the phase voltage of the n-phase AC voltages is obtained by superimposing, on an AC component, negative direct-current (DC) voltage based on the self-bias voltage of the object.

3. The method according to claim 2, wherein the self-bias voltage is calculated in accordance with a condition of plasma processing.

4. The method according to claim 2, wherein the self-bias voltage is detected by a voltage detector configured to detect voltage of the object.

5. The method according to claim 1, further comprising:
   estimating the self-bias voltage of the at least one object under a condition in which a plasma is formed,
   wherein the applying of the n-phase AC voltages to the electrodes is performed such that each AC voltage of the applied AC voltages is offset by the estimated self-bias voltage from a magnitude of the AC voltage.

6. The method according to claim 1, further comprising:
   detecting the self-bias voltage of the at least one object,
   wherein the applying of the n-phase AC voltages to the electrodes is performed using a power supply, such that each AC voltage of the applied AC voltages is offset by the detected self-bias voltage from a magnitude of the AC voltage.

7. The method according to claim 1, further comprising:
   preliminarily storing the self-bias voltage of the at least one object in a memory,
   wherein the applying of the n-phase AC voltages to the electrodes is performed such that each AC voltage of the applied AC voltages is offset by the stored self-bias voltage from a magnitude of the AC voltage.

8. The method according to claim 1, further comprising:
   supplying a heat transfer gas to a space between an upper surface of the mounting table and a back surface of the object.

9. The method according to claim 1, wherein a phase difference between AC voltages of the n-phase AC voltages applied to the electrodes is 120° in a case where n is 3.

10. The method according to claim 1, wherein a phase difference between the n-phase AC voltages applied to the electrodes is 90° in a case where n is 2.

11. The method according to claim 1, wherein a magnitude of negative direct-current (DC) voltage applied to the object is the same as that of the self-bias voltage of the object.

12. The method according to claim 1, wherein the method of attracting at least one object to a table is performed using an etching apparatus.

* * * * *